(12) United States Patent
Andree et al.

(10) Patent No.: US 12,082,386 B2
(45) Date of Patent: Sep. 3, 2024

(54) HOUSING FOR A CONTROL DEVICE, AND CONTROL DEVICE OF SUCH TYPE

(71) Applicant: Conti Temic microelectronic GmbH, Nuremberg (DE)

(72) Inventors: Arthur Andree, Ingolstadt (DE); Thomas Neefe, Ingolstadt (DE); Gerhard Demmelmeier, Ingolstadt (DE); Stefan Bauer, Engelbrechtsmünster (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 388 days.

(21) Appl. No.: 17/425,592

(22) PCT Filed: Jan. 23, 2020

(86) PCT No.: PCT/EP2020/051550
§ 371 (c)(1),
(2) Date: Jul. 23, 2021

(87) PCT Pub. No.: WO2020/152234
PCT Pub. Date: Jul. 30, 2020

(65) Prior Publication Data
US 2022/0104407 A1 Mar. 31, 2022

(30) Foreign Application Priority Data
Jan. 25, 2019 (DE) .................... 10 2019 200 974.3

(51) Int. Cl.
*H05K 9/00* (2006.01)
*G10K 11/162* (2006.01)
*H05K 5/02* (2006.01)

(52) U.S. Cl.
CPC .......... *H05K 9/0079* (2013.01); *G10K 11/162* (2013.01); *H05K 5/02* (2013.01)

(58) Field of Classification Search
CPC .......... H05K 9/00; H05K 9/0079; H05K 5/01; G10K 11/162
(Continued)

(56) References Cited

U.S. PATENT DOCUMENTS

| 5,597,979 A | 1/1997 | Courtney et al. |
| 2007/0270006 A1 | 11/2007 | Herges |

FOREIGN PATENT DOCUMENTS

| DE | 1786047 U | 4/1959 |
| DE | 29602346 U1 | 4/1996 |

(Continued)

OTHER PUBLICATIONS

Machine Translation of JP4192589, Dec. 10, 2008 (Year: 2008).*
(Continued)

*Primary Examiner* — Tremesha S Willis (57) ABSTRACT

A housing for a control device, in particular for a pneumatic control device, is disclosed. The housing comprises the following components: a housing wall, which forms a receiving space for receiving an electronic component of the control device and has at least one opening, and a flexible insulation element, which surrounds the at least one opening in such a way that the flexible insulation element, together with the housing wall, defines a sound insulation space, wherein the flexible insulation element comprises at least one element selected from the group consisting of a flexible film, a flexible textile fabric and a flexible foam layer.

13 Claims, 4 Drawing Sheets

(58) Field of Classification Search
USPC .......................................................... 174/520
See application file for complete search history.

(56) References Cited

FOREIGN PATENT DOCUMENTS

| | | |
|---|---|---|
| DE | 102004051309 A1 | 5/2006 |
| DE | 102014207416 A1 | 10/2015 |
| DE | 102017206360 A1 | 10/2018 |
| JP | 4192589 B2 | 12/2008 |
| WO | 99/22554 A2 | 5/1999 |

OTHER PUBLICATIONS

Office Action dated Jan. 22, 2020 from corresponding German Patent Application No. DE 10 2019 200 974.3.
International Search Report and Written Opinion dated May 4, 2020 from corresponding International Patent Application No. PCT/EP2020/051550.

* cited by examiner

HOUSING FOR A CONTROL DEVICE, AND CONTROL DEVICE OF SUCH TYPE

The present invention relates to housings for a control device, in particular for a pneumatic control device, and to a control device of such type.

Control units usually have electronic components, which are normally located in a housing of the control unit. Depending on the application, these electronic components may vibrate. The vibrations of the electronic components are transmitted, inter alia, as structure-borne sound to the surrounding housing, which, in turn, begins to vibrate. The vibrations of the housing are radiated, inter alia in the form of airborne sound, to the environment of the control unit, where they are perceived as troublesome noises.

Particularly in the case of pneumatic control units, which are used in modern vehicles for pneumatic adjustment of a seat geometry of a vehicle seat, for example, there is frequently the problem that, as a result of vibrations of electromechanical and/or electropneumatic components of the pneumatic control unit, a non-negligible level of noise is audible in the vicinity of the pneumatic control unit. Such noises are perceived as troublesome, particularly by people sitting in the vehicle.

It is therefore the object of the present invention to provide a housing for a control device, in particular a pneumatic control device, and a control device of such type which are distinguished by reduced sound emissions and thus lower noise levels in the vicinity of the control device. Said object is achieved by means of a housing as per patent claim 1 and by means of a control device as per patent claim 14. Preferred and advantageous embodiments of the invention are specified in the dependent claims.

According to a first aspect of the present invention, a housing is provided for a control unit, in particular for a pneumatic control unit. The housing has the following components: a housing wall, which forms a receiving space for receiving electronic components of the control device and has at least one opening, and a flexible insulation element, which surrounds the at least one opening in such a way that the flexible insulation element, together with (at least one part of) the housing wall, defines a sound insulation space, wherein the flexible insulation element is selected from the group consisting of a flexible film, a flexible textile fabric and a flexible foam layer. The insulation element can thus be designed as a film, a textile fabric, a foam layer or even be formed from any desired combination thereof. The flexible textile fabric can comprise a woven fabric, a warp-knitted fabric, a non-crimp fabric, a braided fabric, a weft-knitted fabric, a nonwoven, a felt or combinations thereof, for example, or can be designed as such.

First of all, the at least one opening of the housing according to the invention allows pressure equalization between the inside and the outside of the housing wall, ensuring that vibrations or oscillations of the housing wall, produced, for example, by vibrations of the electronic components, generate less sound pressure. A certain sound insulation can thereby be made possible already. Since the at least one opening is furthermore surrounded by a flexible insulation element in such a way that the flexible insulation element, together with the housing wall, defines a sound insulation space, a pressure equalization can take place below the flexible insulation element, as before. Here, the flexibility of the insulation element is chosen, in particular, in such a way that vibrations of the housing wall produced by vibrations of the electronic components are introduced into the flexible insulation element only to a very small degree. In practice, this results in acoustic decoupling or separation between the housing wall and the environment of the housing, thereby making possible further sound insulation, especially in the audible range.

In a preferred embodiment, the flexible insulation element furthermore has an electrically conductive region, which is designed to conduct at least electrostatic charges, in particular electrostatic charges which may occur in the context of an ESD (electrostatic discharge) test. By virtue of this preferred embodiment, the flexible insulation element can not only have a sound insulating effect but also contributes to ESD protection since an external charge flash, for example, produced in the context of an ESD test for example, can be conducted past the electronic components by means of the flexible insulation element. Since the flexible insulation element additionally has an electrically conductive region, it is possible to create a housing which meets not only the ever stricter acoustic requirements but also the requirements with respect to adequate ESD protection. The flexible insulation element can have an ESD film, for example, or can be designed as a film of this kind since the ESD film itself already has sufficient flexibility combined with sufficiently high electrical conductivity. However, the flexible insulation element can also be designed as a metallized film, whose flexibility under electrical conductivity can be adapted to the respective application. It is also possible for the flexible insulation element to be designed as an electrically conductive textile fabric or as an electrically conductive foam layer. The electrical conductivity can be produced by conductive fibers such as wires, carbon fibers or the like, for example. Moreover, the textile fabric or the foam layer could have been presoaked in graphite, thereby imparting a certain electrical conductivity to the textile fabric or foam layer.

In a particularly preferred embodiment, at least the electrically conductive region of the flexible insulation element is connected electrically to one of the electronic components. This makes it possible to enable electric conduction between the electrically conductive region of the flexible insulation element and the electronic component, which, for its part, is connected to ground, for example. This is advantageous particularly if the housing wall is formed from an electrically nonconductive material.

In another preferred embodiment, the flexible insulation element has a dielectric strength which is chosen so that an electrostatic discharge, in particular an electrostatic discharge of the kind produced in the case of an ESD test, does not break through the insulation element but is instead conducted past the electronic components.

According to another embodiment of the housing according to the invention, the flexible insulation element is mounted on an inner side of the housing wall or a side of the housing wall facing the electronic components. This allows sufficient protection from mechanical stress for the flexible insulation element and furthermore prevents accidental damage to the flexible insulation element.

According to another embodiment, the flexible insulation element is of at least partially corrugated design. The corrugation serves, on the one hand, to form a minimum sound insulation space in the region of the corrugation. On the other hand, the corrugation enables the flexibility of the insulation element to be adapted easily to the respective application.

According to another embodiment, the housing wall has, in the region of the flexible insulation element, projections which extend in the direction of the flexible insulation element and serve as a bearing surface for the flexible insulation element. The projections, in turn, enable a minimum sound insulation space to be set. Moreover, the height of the projections can be adapted, thus enabling the minimum sound insulation space to be adapted to the respective application with little design effort.

According to another embodiment, the flexible insulation element is connected to the housing wall in such a way that the electronic components situated in the receiving space are protected at least partially from dust, drips and/or spray. It is thereby also possible to improve the service life of the control device, and even a certain minimum protection is sufficient here.

According to another embodiment, the flexible insulation element is connected to the housing wall only in an edge region of the flexible insulation element. Connection can be accomplished by welding, stapling, adhesive bonding or the like, for example.

According to a particularly preferred embodiment, the insulation element is connected to the housing wall in the edge region only in some section or sections. In this embodiment, the edge region thus has sections which are not connected to the housing wall, and the edge region has sections which are connected to the housing wall. Those sections of the edge region which are not connected to the housing wall allow fluidic connection of the sound insulation space to the environment of the housing or control device, thus ensuring that the sound insulation space is fluidically connected to the environment in these sections. An air exchange or pressure equalization can thereby take place between the sound insulation space and the environment. The additional air exchange or pressure equalization makes it possible also to use insulation elements which have a relatively low flexibility or which would lead to only inadequate acoustic decoupling or sound insulation without the presence of sections in the edge region which are not connected to the housing wall.

According to another embodiment, at least one of the electronic components extends at least partially through the at least one opening, wherein the flexible insulation element surrounds both the at least one opening and a section of the electronic component which projects from the at least one opening. By means of this embodiment, it is additionally possible to reduce the overall height of the housing since the flexible insulation element can be passed around the section of the electronic component which projects from the at least one opening without the housing wall having to surround this section.

According to another embodiment, the housing wall has at least two openings, of which one of the at least two openings is arranged closer to an electronic component that is sensitive to electrostatic discharge than another of the at least two openings, wherein the flexible insulation element surrounds only that opening of the at least two openings which is arranged closer to the sensitive electronic component. In some applications, sufficient ESD protection can already be ensured merely by covering the sensitive electronic components, e.g. a processor of the control device, by means of the flexible insulation element. Covering the other openings is then not absolutely essential.

Finally, according to a second aspect of the invention, a control device, in particular a pneumatic control device, is provided which has the following components: a housing according to the first aspect or embodiments thereof, and an electronic component, which is arranged in the receiving space of the housing.

Further features and objects of the present invention will become apparent to a person skilled in the art by practicing the present teaching and taking into consideration the accompanying drawings. In the drawings.

Elements of identical design or function are provided with the same reference signs throughout the drawings.

Figure 1:
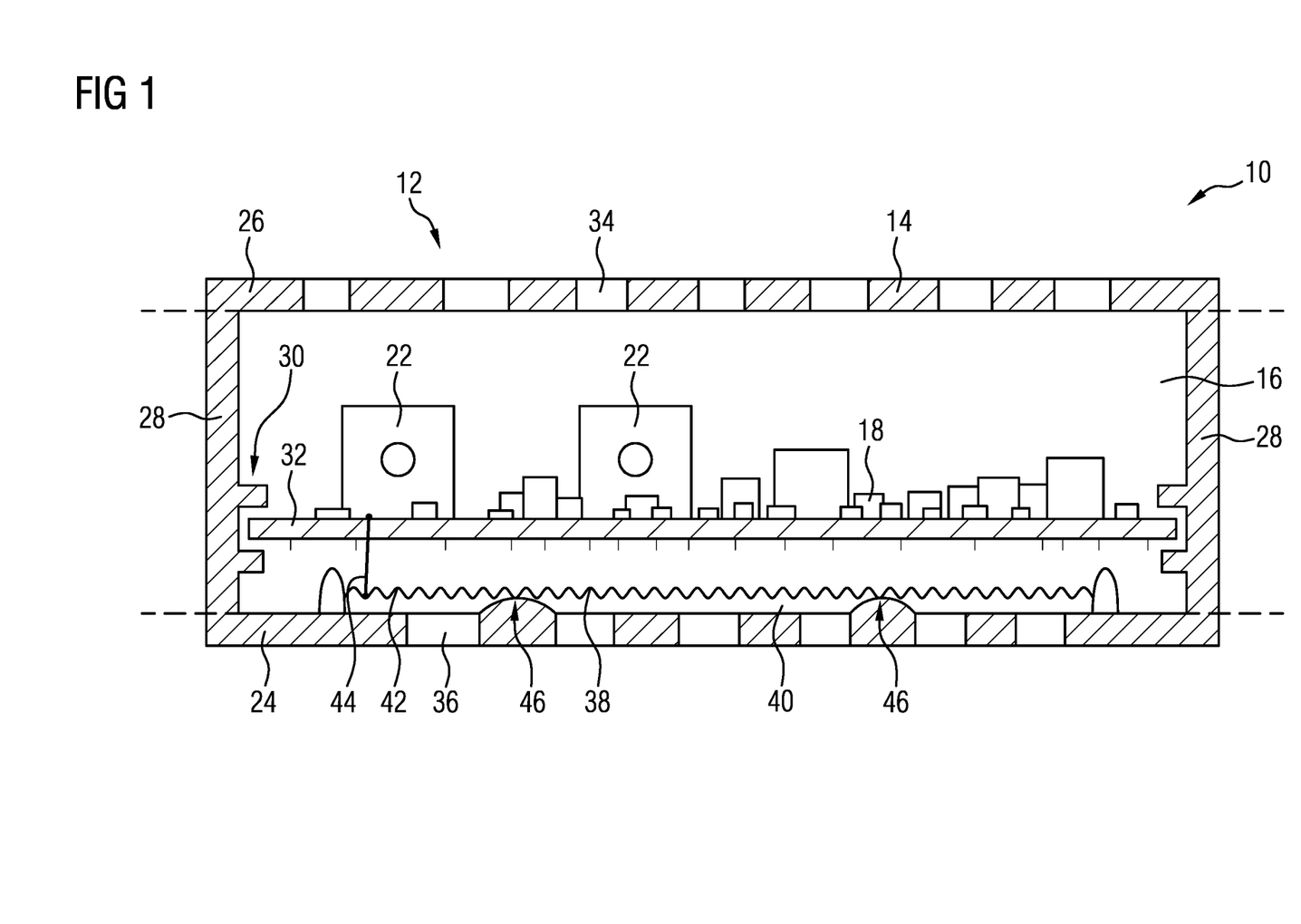
FIG. 1 shows a schematic section through one embodiment of a housing according to the invention.

Reference may first of all be made to FIG. 1, which shows a schematic section through one embodiment of a housing 10 of a control device 12. Here, the control device 12 can be a control device for an electronic control system of a component, such as a vehicle component. However, the control device 12 can also be a pneumatic control device for a pneumatic control system of a component, e.g. for pneumatic adjustment of a vehicle seat of a vehicle.

The housing 10 has a housing wall 14, which forms a receiving space 16 for receiving components of the control device 12. Components of the control device 12 can be electronic components, for example, e.g. a processor 18 of the control device 12. However, it is also possible for components of the control device 12 to be electromechanical or electropneumatic components, e.g. a motor (not shown), a valve 22 or a pump (not shown) of the control device 12.

The housing wall 14 has a bottom wall section 24, a top wall section 26 and a side wall section 28 connecting the bottom wall section 24 and the top wall section 26. The side wall section 28 furthermore has a printed circuit board fastening section 30, which serves to receive a printed circuit board 32 in the receiving space 16 of the housing 14. The components of the control device 12 which have already been mentioned are arranged on this printed circuit board 32.

The bottom wall section 24, the top wall section 26 and the side wall section 28 are indicated schematically by dashed lines in FIG. 1. The division of the housing wall 14 into bottom wall section, top wall section and side wall section can be implemented in any desired manner and is not restricted to the subdivision shown in FIG. 1. It serves rather for purely verbal distinction between different sections of the housing wall 14.

As is furthermore shown in FIG. 1, the housing wall 14 has at least one first opening 34, which, in this case, in the specific example in FIG. 1, is arranged in the top wall section 26, and at least one second opening 36, which, in this case, in the specific example in FIG. 1, is arranged in the bottom wall section 24. The openings 34, 36 form a fluidic connection between the inside and the outside of the housing wall 14. The fluidic connection between the inside and the outside of the housing wall 14 makes it possible for vibrations of the components 18 to 22 that are transmitted to the housing wall 14 to be emitted in an attenuated manner since a pressure equalization can take place between the inside and the outside of the housing wall 14.

As is furthermore shown in FIG. 1, the housing 10 additionally has a flexible insulation element 38. The flexible insulation element 38 surrounds the at least one second opening 36 (as well as further openings in the bottom wall section 24) in such a way that a sound insulation space 40 is formed between the flexible insulation element 38 and the housing wall 14 or bottom wall section 24. In other words, the flexible insulation element 38, together with at least part of the housing wall 14, defines a sound insulation space 40. By virtue of the flexibility of the insulation element 38, a further pressure equalization can take place below the flexible insulation element 38. In particular, the flexibility of the insulation element 38 is chosen in such a way that vibrations of the housing wall 14 produced by vibrations of the components 18 to 22 are introduced into the flexible insulation element 38 only to a very small degree. This has the effect that sound radiation from the housing wall 14 into the environment of the housing 10 is attenuated.

The flexible insulation element 38 can, for example, have or be formed from a flexible film, a flexible textile fabric or a flexible foam layer which surrounds the openings in the bottom wall section 24 loosely, i.e. in an unstressed state.

As is furthermore shown in FIG. 1, the insulation element 38 is of at least partially corrugated design or at least partially has corrugation 42. By means of the corrugation 42, the flexibility of the insulation element 38 can be adapted to the respective application. Moreover, the corrugation 42 creates a minimum sound insulation space between the insulation element 38 and the housing wall 14 or bottom wall section 24. The corrugation 42 can be stamped onto the flexible insulation element 38, for example.

Apart from the flexibility discussed above, the flexible insulation element 38 also has an electrically conductive region. The electrically conductive region is designed to conduct electrostatic charges, in particular electrostatic charges which may occur in the context of an ESD test. By means of the electrically conductive region, it is possible for electrostatic charges to be conducted electrically in such a way that they are harmless for the components 18 to 22 of the control device 12. The electrically conductive region of the flexible insulation element 38 thus allows a certain ESD protection. The flexible insulation element 38 thus performs a dual function. On the one hand, it is possible, by means of the flexibility of the insulation element 38, to improve sound insulation, especially in the audible range, and, on the other hand, sufficient ESD protection is ensured by means of the conductive region of the insulation element 38. For this purpose, the insulation element 38 can be designed as an ESD film, as a metallized film or as an electrically conductive textile fabric or as an electrically conductive foam layer. The electrical conductivity can be achieved by means of conductive fibers such as wires, carbon fibers or the like, for example. It is also possible to presoak the textile fabric or the foam layer in graphite, thereby imparting a certain electrical conductivity to the textile fabric or foam layer.

As is furthermore shown in FIG. 1, the electrically conductive region is electrically connected to one of the electronic components 18 to 22, this being indicated by the electric lead 44. This enables electric charges to be transmitted from the insulation element 38 to ground, for example. This is advantageous especially if the housing wall 14 is formed from an electrically nonconductive material, as is often the case with housings of control devices.

Alternatively or in addition, the electric insulation element 38 has a dielectric strength with respect to electrostatic discharges. Here, the dielectric strength is chosen in such a way that electrostatic discharges that may occur in the context of an ESD test do not break through the insulation element 38. Instead, these discharges are carried along the insulation element 38 in order to protect the electronic components 18 to 22. In order to obtain a sufficient dielectric strength, the insulation element 38 can be produced from a material suitable for this purpose or can comprise said material. It is also possible to choose the thickness of the insulation element 38 in such a way that the necessary dielectric strength of the insulation element 38 is achieved.

As is furthermore shown in FIG. 1, the housing wall 14 or bottom wall section 24 has projections 46, which extend in the direction of the flexible insulation element 38. The projections 46 serve as a bearing surface for the flexible insulation element 38 and—like the corrugation 42—make possible a certain minimum sound insulation space.

As is furthermore shown in FIG. 1, the flexible insulation element 38 is arranged on the inside of the bottom wall section 24 or on the side of the bottom wall section 24 which faces the components 18 to 22. It is thereby possible to achieve the greatest possible protection for the insulation element 38 from mechanical stress or damage.

As is furthermore shown in FIG. 1, the printed circuit board fastening section 30 is closer to the bottom wall section than to the top wall section 26. In the case of an electrostatic discharge, it is thus primarily the openings in the bottom wall section 24 which must have sufficient ESD protection. In the specific example in FIG. 1, the flexible insulation element 38 is therefore situated between the printed circuit board 32 and the bottom wall element 24 in order to cover the openings in the bottom wall section 24 there. In contrast, the openings in the region of the top wall section are not surrounded by an insulation element since the distance between the electronic components 18 to 22 and the top wall section 26 is sufficient to ensure a certain ESD protection without an insulation element.

Figure 2:
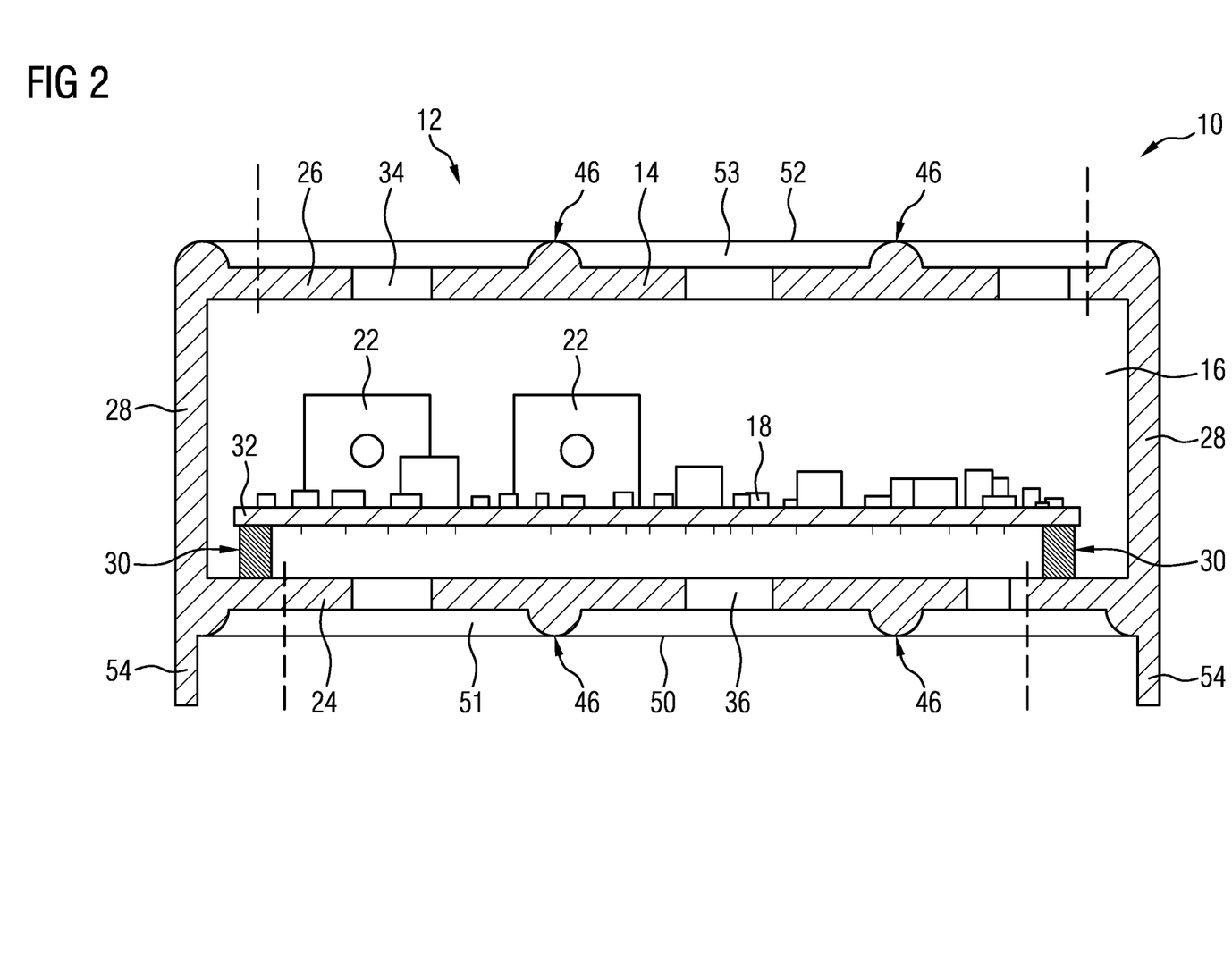
FIG. 2 shows a schematic section through another embodiment of a housing according to the invention.

Reference may now be made to FIG. 2, which shows another embodiment of a housing 10 according to the invention. In contrast to the embodiment according to FIG. 1, the embodiment according to FIG. 2 has two flexible insulation elements, each of which is arranged on an outer side of the housing wall 14.

A first flexible insulation element 50 surrounds the openings provided in the bottom wall section 24, and a second flexible insulation element 52 surrounds the openings provided in the top wall section 26. In this case, the first flexible insulation element 50, together with the housing wall 14 or bottom wall section 24, defines a first sound insulation space 51, which is fluidically connected to the receiving space 16 via the openings 36. Analogously, the second flexible insulation element 52, together with the housing wall 14 or top wall section 26, defines a second sound insulation space 53, which is fluidically connected to the receiving space 16 via the openings 34.

Both the bottom wall section 24 and the top wall section 26 have the projections 46 already mentioned, which extend in the direction of the respective insulation element 50 or 52 and serve as a bearing surface for the respective insulation element 50 or 52. In order to ensure damage-free installation of the housing 10, the housing wall 14 can additionally have spacers 54 in the region of the side wall section 28. In other embodiments, instead of spacers, appropriate precautions can be taken on the installation side to protect the insulation elements situated on the outside.

Of course, it is also possible, in another embodiment (not shown) of the housing 10 according to the invention, for only the openings 34 in the top wall section 26 or only the openings 36 in the bottom wall section 24 to be surrounded by a respective insulation element. It is also conceivable that only the top wall section 26 or only the bottom wall section 24 has corresponding projections 46.

In addition, a combination of an external insulation element as in the example of FIG. 1 with an internal insulation element as in the example of FIG. 2 is conceivable.

Figure 3:
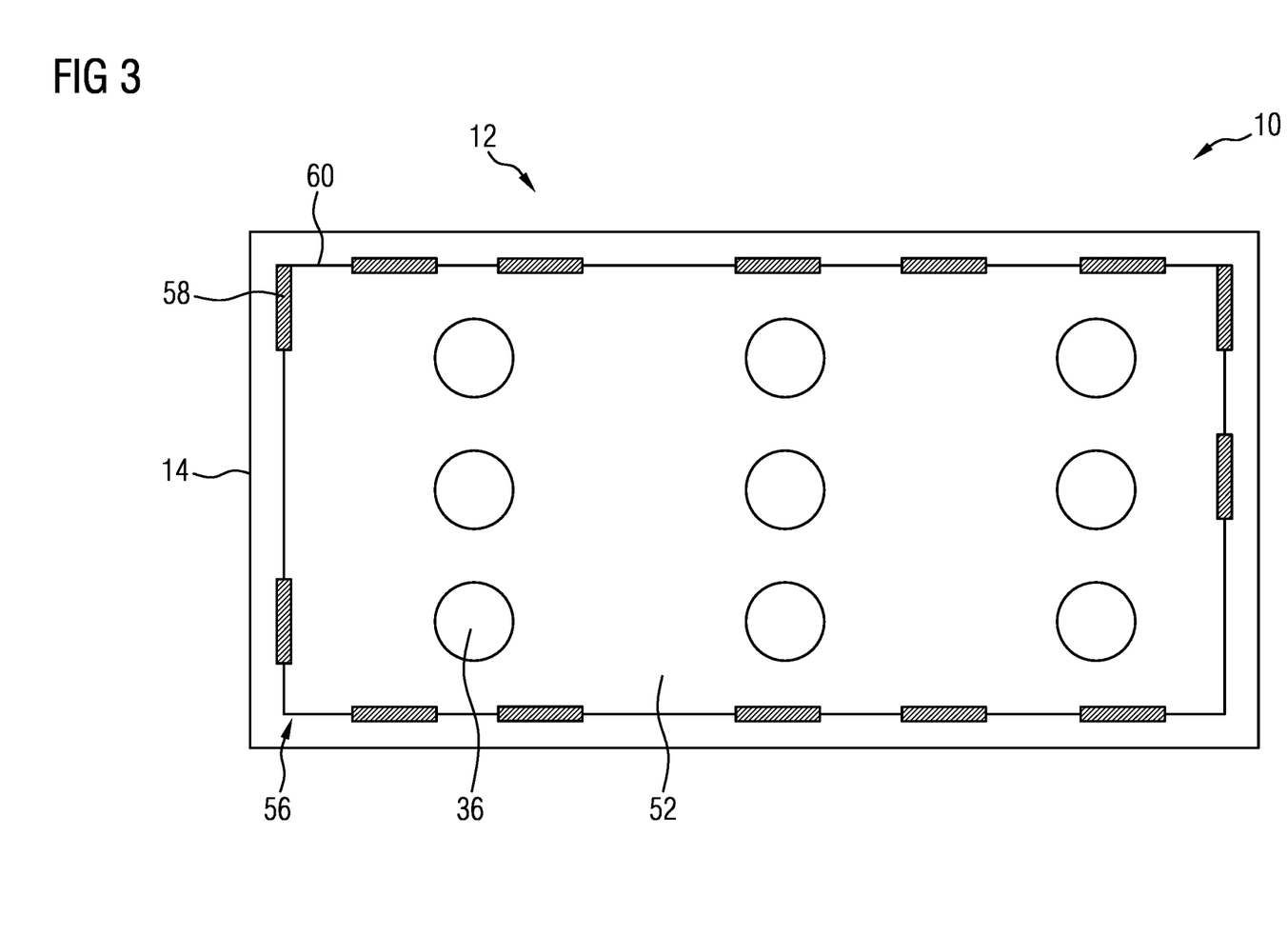
FIG. 3 shows a schematic plan view of another embodiment of a housing according to the invention.

Reference may now be made to FIG. 3, which shows a schematic plan view of another embodiment of the housing 10 according to the invention.

As shown in FIG. 3, the flexible insulation element 52 is connected to the housing wall 14 only in an edge region 56. As has already been mentioned, this connection can be accomplished by welding, stapling, adhesive bonding or the like, for example.

As can also be seen in FIG. 3, not all of the edge region 56 is connected to the housing wall 14. On the contrary, the edge region 56 is connected to the housing wall 14 only in some section or sections. By way of example, FIG. 3 shows sections 58 illustrated as thickened portions, which are connected to the housing wall 14, while sections 60 illustrated as thin portions are not connected to the housing wall 14. In particular, the sections 60 in which there is no connection between the flexible insulation element 52 and the housing wall 14 lead to an air exchange or pressure equalization between the sound insulation space and the environment of the housing 10. The additional air exchange or pressure equalization makes it possible to achieve sound insulation even with less flexible insulation elements.

Although the openings 36 are shown as circular openings in FIG. 3, the openings may also have other shapes. Nor do the openings 36 have to be arranged in a symmetrically distributed manner, as shown in FIG. 3. The decisive factor is that the housing wall 14 does in fact have openings which contribute to an air exchange or pressure equalization.

The sections 58, 60 can also be arranged in a symmetrically or non-symmetrically distributed manner in the edge region of the insulation element 52.

Figure 4:
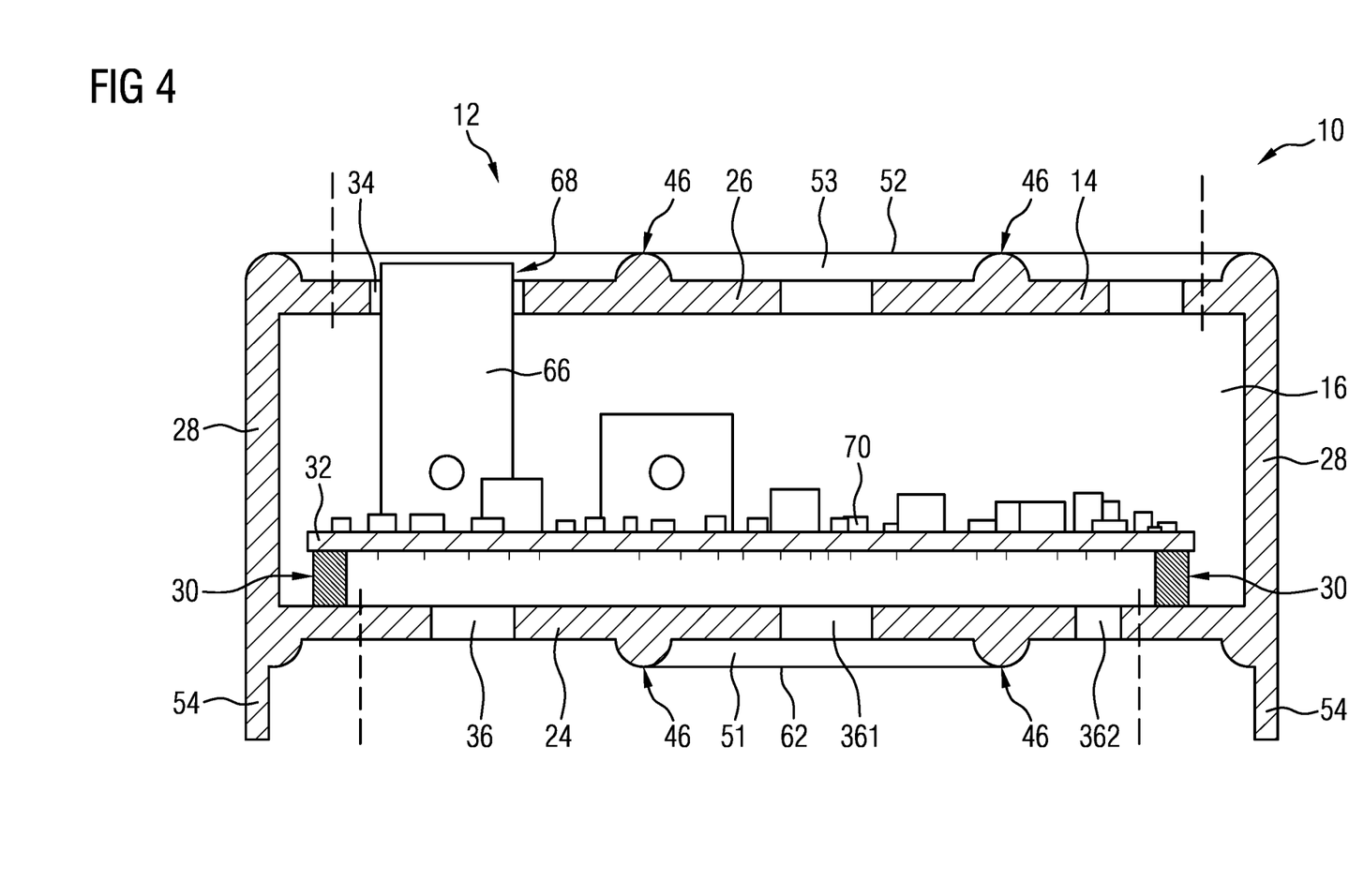
FIG. 4 shows a schematic section through another embodiment of a housing according to the invention.

Finally, reference may also be made to FIG. 4, which shows another embodiment of a housing 10 according to the invention. As in the embodiment according to FIG. 2, the embodiment according to FIG. 4 has two flexible insulation elements 52 and 62 on an outer side of the housing wall 14.

In contrast to the embodiments described so far, however, in the embodiment in FIG. 4, one of the components of the control unit 12 (designated here by the reference numeral 66 by way of example) extends at least partially through one of the openings 34 in the top wall section 26. Here, the flexible insulation element 52 surrounds not only the openings present in the top wall section 26 but also that section 68 of the component 66 which projects from the corresponding opening 34. The flexible insulation element 52 thus also contributes to enabling the height of the housing 10 to be reduced since it is not necessary for the component 66 to be accommodated completely in the receiving space 16 or to be surrounded completely by the housing wall 14. In other embodiments, multiple components may also extend through a single or multiple openings.

As can furthermore finally be seen in FIG. 4, the flexible insulation element 62 on the underside of the bottom wall section 24 does not surround all the openings 36, 361, 362 of the bottom wall section 24, but only opening 361. In comparison with the other openings 36, 362 (as well as the openings 34 in the top wall element 26), opening 361 is closer to an electronic component 70 of the control unit 12 which is particularly sensitive to an electrostatic discharge and therefore requires special ESD protection. For this reason, the flexible insulation element 62 surrounds at least opening 361, whereas the other openings 34, 36, 362 are far enough away from the component 70 to ensure sufficient ESD protection even without the insulation element. A particularly sensitive electronic component of the control unit 12 is, for example, a processor of the control unit 12.

Although the particularly critical opening 361 is a single opening in FIG. 4, it is, of course, also possible for a plurality of openings to be critical for ESD protection. In such cases, the flexible insulation element 62 can, of course, surround all these critical openings.

Although the flexible insulation elements 50, 52 and 62 are not shown in corrugated form in FIGS. 2 to 4, it is, of course, also possible for these to be of corrugated design.

The present invention provides a housing 10 and a control device 12 which are distinguished by improved ESD protection with reduced sound emissions or noise generation.

The invention claimed is:

1. A housing for a pneumatic control device, comprising:
   a housing wall defining a receiving space for receiving an electronic component of the pneumatic control device and having at least one opening; and
   a flexible insulation element surrounding the at least one opening in such a way that the flexible insulation element, together with the housing wall, defines a sound insulation space, wherein the flexible insulation element comprises at least one element selected from the group consisting of a flexible film, a flexible textile fabric and a flexible foam layer,
wherein the flexible insulation element comprises an electrically conductive region configured to conduct electrostatic charges.

2. The housing as claimed in claim 1, wherein the electrically conductive region is connected electrically to the electronic component.

3. The housing as claimed in claim 1, wherein the flexible insulation element has a sufficient dielectric strength so that at least one electrostatic discharge, produced during an ESD test, does not break through the flexible insulation element.

4. The housing as claimed in claim 1, wherein the housing wall is formed from an electrically nonconductive material.

5. The housing as claimed in any claim 1, wherein the flexible insulation element is mounted on an inner side of the housing wall.

6. The housing as claimed in claim 1, wherein the flexible insulation element is at least partially corrugated.

7. The housing as claimed in claim 1, wherein the housing wall has, in a region of the flexible insulation element, projections which extend in a direction of the flexible insulation element and serve as a bearing surface for the flexible insulation element.

8. The housing as claimed in claim 1, wherein the flexible insulation element is connected to the housing wall and at least partially protecting the electronic component situated in the receiving space from at least one of dust, drips and spray.

9. The housing as claimed in claim 1, wherein the flexible insulation element is connected to the housing wall only in an edge region of the flexible insulation element.

10. The housing as claimed in claim 9, wherein the flexible insulation element is connected to the housing wall in the edge region only in some but not all section or sections.

11. The housing as claimed in claim 1, wherein the electronic component extends at least partially through the at least one opening, and
   the flexible insulation element surrounds both the at least one opening and a section of the electronic component which projects from the at least one opening.

12. The housing as claimed in claim 1, wherein the at least one opening comprises at least two openings, of which one of the at least two openings is arranged closer to the electronic component that is sensitive to electrostatic discharge than another of the at least two openings, and wherein the flexible insulation element surrounds only the opening which is arranged closer to the sensitive electronic component.

13. The pneumatic control device, comprising:
   the housing as claimed in claim 1,
   the electronic component, which is arranged in the receiving space of the housing.

\* \* \* \* \*